US011393790B2

(12) United States Patent
Hiscock et al.

(10) Patent No.: US 11,393,790 B2
(45) Date of Patent: Jul. 19, 2022

(54) MEMORY WITH TSV HEALTH MONITOR CIRCUITRY

(71) Applicant: Micron Technology, Inc., Boise, ID (US)

(72) Inventors: Dale H. Hiscock, Boise, ID (US); Evan C. Pearson, Boise, ID (US); John H. Gentry, Boise, ID (US); Michael J. Scott, Boise, ID (US); Greg S. Gatlin, Mountain Home, ID (US); Lael H. Matthews, Meridian, ID (US); Anthony M. Geidl, Boise, ID (US); Michael Roth, Boise, ID (US); Markus H. Geiger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 66 days.

(21) Appl. No.: 16/706,642

(22) Filed: Dec. 6, 2019

(65) Prior Publication Data

US 2021/0175208 A1 Jun. 10, 2021

(51) Int. Cl.
*H01L 25/065* (2006.01)
*H01L 21/66* (2006.01)
*H01L 25/00* (2006.01)

(52) U.S. Cl.
CPC .......... *H01L 25/0657* (2013.01); *H01L 22/14* (2013.01); *H01L 22/34* (2013.01); *H01L 25/50* (2013.01); *H01L 2225/06541* (2013.01); *H01L 2225/06596* (2013.01)

(58) Field of Classification Search
CPC ..... H01L 25/0657; H01L 25/50; H01L 22/14; H01L 22/34; H01L 2225/06596; H01L 2225/06541
See application file for complete search history.

(56) References Cited

U.S. PATENT DOCUMENTS

| 2010/0013512 A1* | 1/2010 | Hargan ................ G11C 29/022 324/762.02 |
| 2013/0009278 A1* | 1/2013 | Lee ..................... H01L 23/5256 257/530 |
| 2016/0247747 A1* | 8/2016 | Janzen .................... H01L 21/82 |
| 2019/0238134 A1* | 8/2019 | Lee ..................... H03K 19/1776 |
| 2020/0096558 A1* | 3/2020 | Ide ..................... G01R 31/2853 |

* cited by examiner

*Primary Examiner* — Kyoung Lee
*Assistant Examiner* — Christina A Sylvia
(74) *Attorney, Agent, or Firm* — Perkins Coie LLP

(57) ABSTRACT

Memory devices and systems with TSV health monitor circuitry, and associated methods, are disclosed herein. In one embodiment, a memory device includes a plurality of memory dies, a plurality of through-silicon vias (TSVs) in electrical communication with the memory dies; and circuitry. In some embodiments, the circuitry is configured to electrically couple a pair of TSVs of the plurality of TSVs to form a passive circuit. For example, the circuitry can activate a transistor electrically positioned between TSVs of the pair of TSVs to electrically couple the pair of TSVs. In these and other embodiments, the circuitry applies a test voltage to the pair of TSVs using the passive circuit to determine whether a TSV of the pair of TSVs includes degradation.

20 Claims, 7 Drawing Sheets

MEMORY WITH TSV HEALTH MONITOR CIRCUITRY

TECHNICAL FIELD

The present disclosure is related to memory systems, devices, and associated methods. In particular, the present disclosure is related to memory devices with through-silicon via (TSV) heath monitor circuitry.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), ferroelectric random access memory (FeRAM), resistive random access memory (RRAM), and magnetic random access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. The drawings should not be taken to limit the disclosure to the specific embodiments depicted, but are for explanation and understanding only.

DETAILED DESCRIPTION

A void in a through-silicon via (TSV) is a defect and/or deterioration affecting the TSVs resistance and capacitance. A void can cause a TSV to become discontinuous such that the TSV is unable to adequately transmit signals. To locate and identify voids in TSVs before they are integrated into a three-dimensional stack (3DS) and/or packaged into a memory device, random samples undergo physical failure analysis (PFA) and electrical failure analysis (EFA). If voiding is found, entire lots are scrapped because the sample represents a strong likelihood of future reliability failure in TSVs of that lot. As it is not likely that every TSV in the lot exhibits voiding, however, scrapping of the entire lot likely wastes a large amount of non-defective material.

Figure 1:
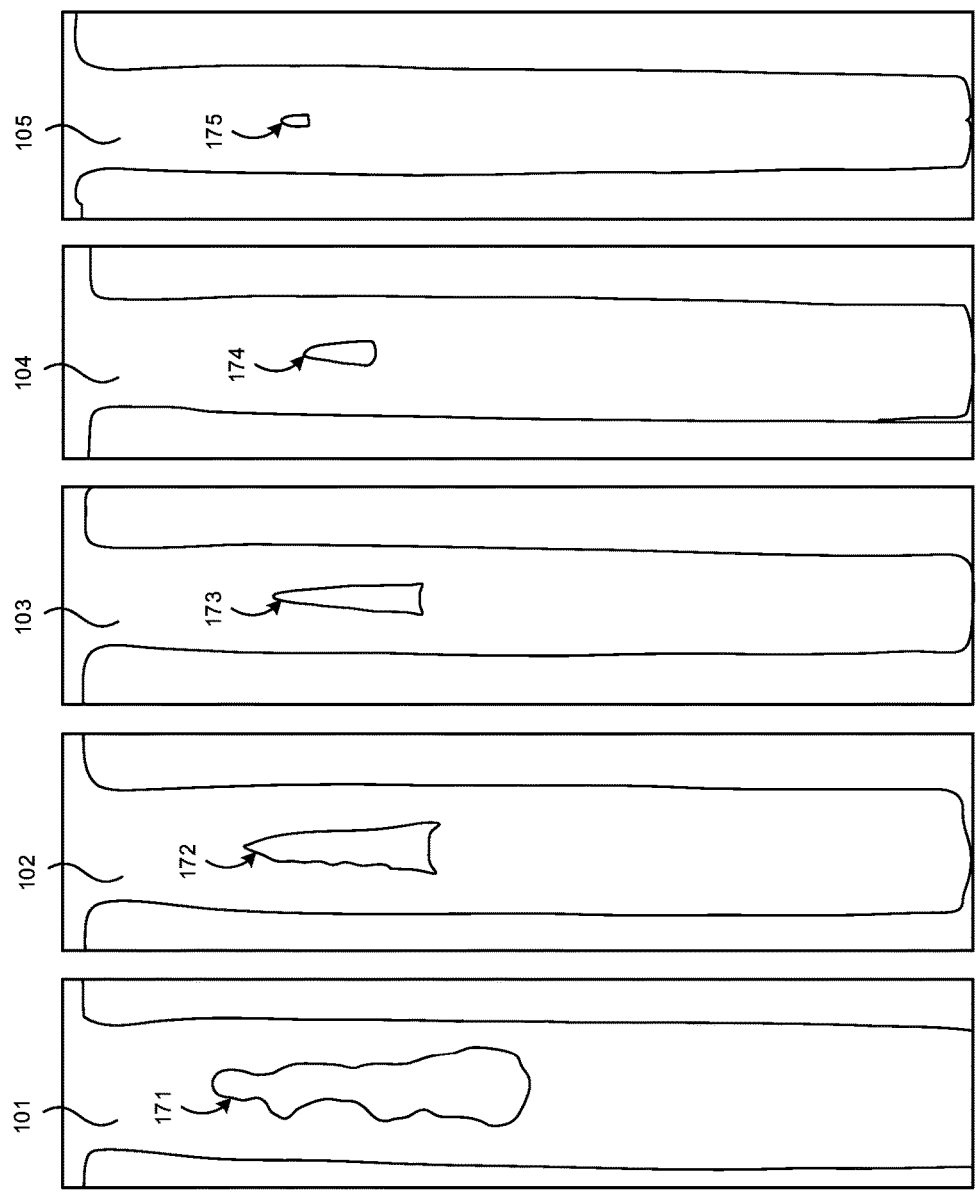
FIG. 1 is a block diagram schematically illustrating various through-silicon via (TSV) voids.

Furthermore, PFA and EFA are subjective processes and not true screens. For example, FIG. 1 is a block diagram schematically illustrating various voids 171-175 in respective TSVs 101-105. The void 171 in the TSV 101 is a substantive void that would likely fail both PFA and EFA on a consistent basis. On the other hand, the voids 174 and 175 in the TSVs 104 and 105, respectively, are relatively minor and would likely pass both PFA and EFA on a consistent basis. In contrast, the voids 172 and 173 in the TSVs 102 and 103, respectively, are more substantive than the voids 174 and 175 but less substantive than the void 171. Thus, the TSVs 102 and 103 are borderline defective and not likely to pass or fail PFA and EFA on a consistent basis, meaning that there exists a high probability that TSVs similar to the TSVs 102 and 103 pass PFA and EFA despite exhibiting substantive voiding. Moreover, although the TSVs 102-105 may pass PFA and EFA under random sampling before being integrated into a 3DS and before being packaged, the respective voids 172-175 can further degrade (e.g., migrate and/or crack) when subjected to temperature and/or electrical stress during use. As such, the TSVs 102-105 may become defective after they are incorporated into a 3DS and packaged into a memory device, which is a scenario that random sampling cannot detect or prevent.

Accordingly, as discussed in greater detail below, the technology disclosed herein relates to memory systems and devices with TSV health monitor circuitry. In some embodiments, a memory device and/or memory die includes transistors between TSVs (e.g., between signaling TSVs) of the memory device/die. These "die transistors" form switchable connections between neighboring (e.g., immediately adjacent, nearest, etc.) TSVs. For example, the transistors can be selectively activated to form passive test circuits that can facilitate voltage/current measurements on respective TSVs to characterize the health of the respective TSVs and/or to detect degradation (e.g., voids, defects, and/or signs of reliability failure) in the TSVs. In some embodiments, multiple memory dies of a 3DS include transistors between the same TSVs such that the passive test circuits can be formed (and the health of the respective TSVs characterized and/or monitored) to a variety of different heights in the 3DS. Therefore, every connected TSV (e.g., all or a subset of the signaling TSVs) of a memory device and/or die can be tested, and the health of each TSV can be monitored even after the TSVs are integrated into a 3DS and/or are packaged into a memory device. Thus, memory dies/devices configured in accordance with embodiments of the present technology can detect voids or other defects that form and/or degrade after integration into a 3DS and/or after packaging (e.g., due to temperature and/or electrical stress). In these and other embodiments, when degradation is identified and located, the memory die including the defective portion of a TSV and/or one or more memory dies above that memory die in the 3DS can be deactivated. In this manner, at least a portion of the memory device can be recovered when a defect or failure is detected in a TSV of a memory die in the 3DS.

A person skilled in the art will understand that the technology may have additional embodiments and that the technology may be practiced without several of the details of the embodiments described below with reference to FIGS. 1-5. In the illustrated embodiments below, the memory devices and systems are primarily described in the context of memory dies arranged in a three-dimensional stack (3DS) and communicatively coupled using TSVs. Memory devices and systems configured in accordance with other embodiments of the present technology, however, can include other three-dimensional stack arrangements (e.g., memory dies communicatively coupled using wire bonds, direct chip attachments, and/or other stacking technologies) and/or can include other arrangements of memory dies (e.g., non-3DS arrangements of memory dies). Therefore, memory devices and systems of other embodiments can include circuitry configured to monitor health of other communication technologies (e.g., wire bonds, direct chip attachments, etc.) in addition to or in lieu of TSV health monitor circuitry.

Furthermore, in the illustrated embodiments below, the memory device and systems are primarily described in the context of devices incorporating DRAM storage media. Memory devices configured in accordance with other embodiments of the present technology, however, can include other types of memory devices and systems incorporating other types of storage media, including PCM, SRAM, FRAM, RRAM, MRAM, read only memory (ROM), erasable programmable ROM (EPROM), electrically erasable programmable ROM (EEROM), ferroelectric, magnetoresistive, and other storage media, including non-volatile, flash (e.g., NAND and/or NOR) storage media.

Figure 2A:
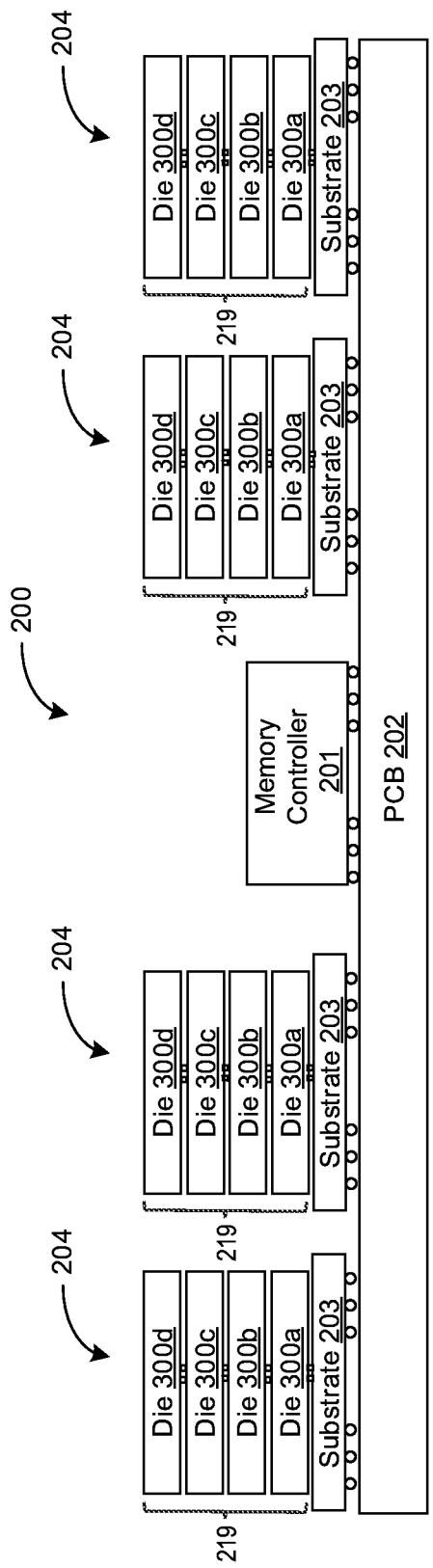
FIG. 2A is a block diagram schematically illustrating a memory system configured in accordance with various embodiments of the present technology.

FIG. 2A is a block diagram schematically illustrating a memory system 200 configured in accordance with various embodiments of the present technology. The memory system 200 can include a memory controller 201 (e.g., a field programming gate array (FPGA) or other suitable memory controller) and one or more memory devices 204 (e.g., one or more dynamic random-access memory (DRAM) devices) electrically connected to the memory controller 201 via a printed circuit board (PCB) 202 (e.g., via one or more electrical contacts and/or traces). The memory controller 201 can be configured to control one or more operations of the memory system 200.

Individual memory devices 204 of the memory system 200 can include a package substrate 203 and one or more memory dies 300. As illustrated in FIG. 2A, each of the memory devices 204 includes four memory dies 300 (labeled individually as first memory die 300a, second memory die 300b, third memory die 300c, and fourth memory die 300d). The first memory die 300a of each memory device 204 is attached to the package substrate 203, and the second through fourth memory dies 300b-300d are stacked on top of the first memory die 300a to form a 3DS 219. In some embodiments, the first through fourth memory dies 300a-300d are each electrically connected to the package substrate 203 (e.g., via one or more electrical contacts and/or traces), which in turn can be electrically connected to the PCB 202. For example, the first, the second, the third, and/or the fourth memory dies 300a-300d can be electrically connected to the package substrate 203 via solder bumps or other electrical contacts (e.g., bond pads, wire bonds, die attach adhesives, TSVs, etc.) formed between the first, second, third, and/or fourth memory dies 300a-300d and the package substrate 203.

The memory system 200 can be connected to any one of a number of electronic devices that is capable of utilizing memory for the temporary or persistent storage of information, or a component thereof. For example, the memory system 200 can be operably connected to a host device (not shown). The host device may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to the memory system 200, although, in other embodiments, the host device may be indirectly connected to the memory system 200 (e.g., over a networked connection or through intermediary devices).

Figure 2B:
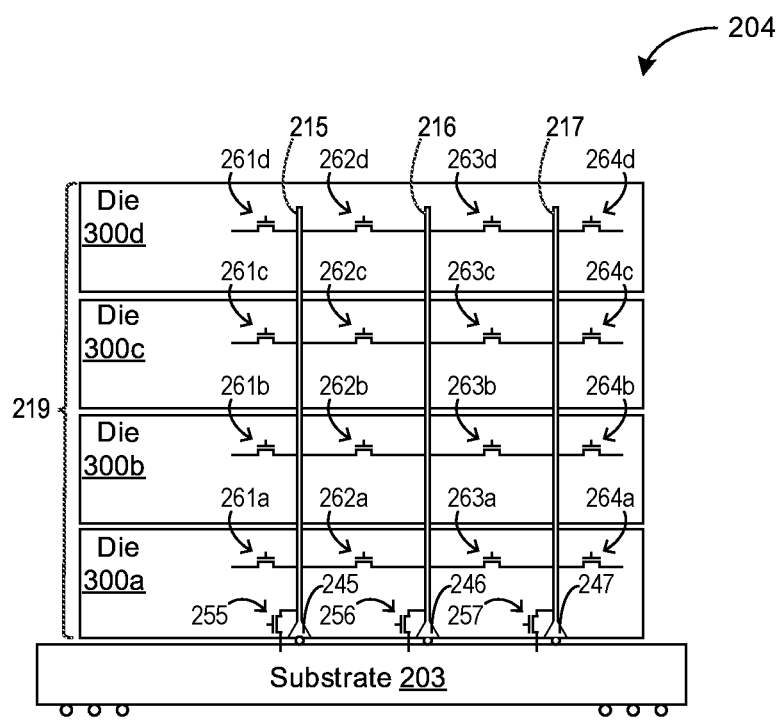
FIG. 2B is a block diagram schematically illustrating a memory device configured in accordance with various embodiments of the present technology.

FIG. 2B is a block diagram schematically illustrating a memory device 204 of FIG. 2A. As shown in FIG. 2B, the memory device 204 includes a plurality of TSVs 215-217. In some embodiments, at least one of the TSVs 215-217 is a signaling TSV configured to transmit signals to and/or from the first, the second, the third, and/or the fourth memory dies 300a-300d. For example, signals received from the package substrate 203 can enter respective input buffers 245-247 and can be transmitted to one or more of the memory dies 300a-300d via one or more of the TSVs 215-217. In these and other embodiments, at least one of the TSVs 215-217 is a power TSV configured to deliver power to the first, the second, the third, and/or the fourth memory dies 300a-300d. In other embodiments, the memory device 204 includes transistors between only signaling TSVs and not power TSVs of the memory device 204 (e.g., in a memory device 204 having multiple redundant power TSVs and/or in a memory device where failure/degradation of a single power TSV will not induce failure). In the illustrated embodiment, the TSVs 215-217 extend from the package substrate 203 to the top memory die (e.g., the fourth memory die 300d) of the 3DS 219. Thus, the TSVs 215-217 electrically couple the firth through fourth memory dies 300a-300d to the package substrate 203. In other embodiments, any one of the TSVs 215-217 can have a different height than illustrated, and/or can electrically couple individual memory dies 300a, 300b, 300c, and/or 300d to one another and/or to the package substrate 203. Furthermore, although the memory device 204 is illustrated as having three TSVs 215-217 in FIG. 2B, memory devices 204 of other embodiments of the present technology can have a greater or lesser number of TSVs (e.g., one, two, and/or four or more TSVs) than shown.

In contrast with conventional memory devices, the memory device 204 configured in accordance with various embodiments of the present technology includes transistors 261-264 ("die transistors 261-264") and bypass transistors 255-257. The die transistors 261-264 are used to electrically couple two or more of the TSVs 215-217 to one another. In some embodiments, each of the first through fourth memory dies 300a-300d in the 3DS 219 include die transistors 261-264 between the TSVs 215-217. For example, each of the first through fourth memory dies 300a-300d can include die transistors 261-264 between two or more neighboring (e.g., immediately adjacent, nearest, etc.) signaling TSVs. A benefit of these embodiments is that die differentiation is not required during assembly of a 3DS 219 as each die is largely identical and includes dies transistors 261-264. In other embodiments, only a subset of the memory dies 300 (e.g., only the fourth memory die 300d) of the memory device 204 includes die transistors 261-264 between the TSVs 215-217, requiring die differentiation during assembly of a 3DS 219 unless memory dies 300 including die transistors 261-264 are randomly positioned/stacked in the 3DS 219. The bypass transistors 255-257 are electrically connected directly to a corresponding TSV to allow signals to electrically bypass respective input buffers 245-247 and avoid measuring the resistance added by each of the input buffers 245-247.

As described in greater detail below, the bypass transistors 255-257 and the die transistors 261-264 in one for more memory dies 300 of the memory device 204 can be selectively activated to form a circuit (e.g., a temporary test circuit). When a circuit is formed using bypass transistors and one or more die transistors, a test signal can be transmitted up one TSV and be returned down another TSV of the formed circuit. Voltage, current, and/or resistance measurements of the circuit can be taken using the test signal, and the measurements can be compared to other measurements captured over other TSV combinations to identify potentially defective TSVs and/or to locate voids or other defects in the respective TSVs. Furthermore, because memory devices 204 in some embodiments include the die transistors 261-264 in multiple memory dies 300 of a respective 3DS 219, the die transistors 261-264 and the bypass transistors 255-257 can be used to form temporary test circuits of various heights up the 3DS 219. In this manner, the location of a defect and/or void can be located to within an individual memory die 300 of the 3DS 219. In turn, the memory die 300 that includes the defective/voided TSV and/or any one of more of the memory dies 300 above it in the 3DS 219 can be deactivated such that at least a portion of the memory device 204 may be recovered. In other embodiments, the memory device 204 can use a redundant TSV (not shown) of the memory device 204 to replace the defective TSV while keeping each of the previously activated memory dies 300 of the 3DS 219 operational. In still other embodiments, the memory device 204 can use the die transistors to avoid defective portions of a TSV. For example, the memory device 204 can activate one or more die transistors to route a signal transmitted over a defective or failing TSV (e.g., the TSV 215) to another TSV (e.g., to the TSV 216 using the die transistor 262a). In turn, the other TSV (e.g., the TSV 216) can transmit the signal to appropriate circuitry of one or more memory dies 300 of the memory device 204. Additionally, or alternatively, the other TSV (e.g., the TSV 216) can reroute the signal back to the defective or failing TSV (e.g., the TSV 215) at a point higher up the 3DS than a defective or failing portion of the TSV (e.g., a portion of the TSV 215 within the memory die 300b) using, for example, one or more other die transistors (e.g., the die transistor 262c and/or 262d).

Although the memory devices 204 illustrated in FIGS. 2A and 2B are each illustrated with four memory dies 300a-300d, one or more memory devices 204 configured in accordance with other embodiments of the present technology can include a greater or lesser number of memory dies 300 (e.g., one memory die, two memory dies, three memory dies, or more than four memory dies) than illustrated. In these and other embodiments, the orientation of the memory dies 300 included in a memory device 204 can vary. For example, the first through fourth memory dies 300a-300d illustrated in FIGS. 2A and 2B are each oriented face down (e.g., toward the package substrate 203) in a back-to-face orientation. In other embodiments, the first through fourth memory dies 300a-300d can be oriented face up (e.g., away from the package substrate 203) such the memory dies 300a-300d are arranged in a face-to-back, face-to-face, and/or back-to-back orientation on a package substrate 203. In these and still other embodiments, any one or more of the memory dies 300a-300d can be arranged side-by-side on the package substrate 203, as opposed to the stacked arrangement illustrated in FIGS. 2A and 2B.

Figure 3:
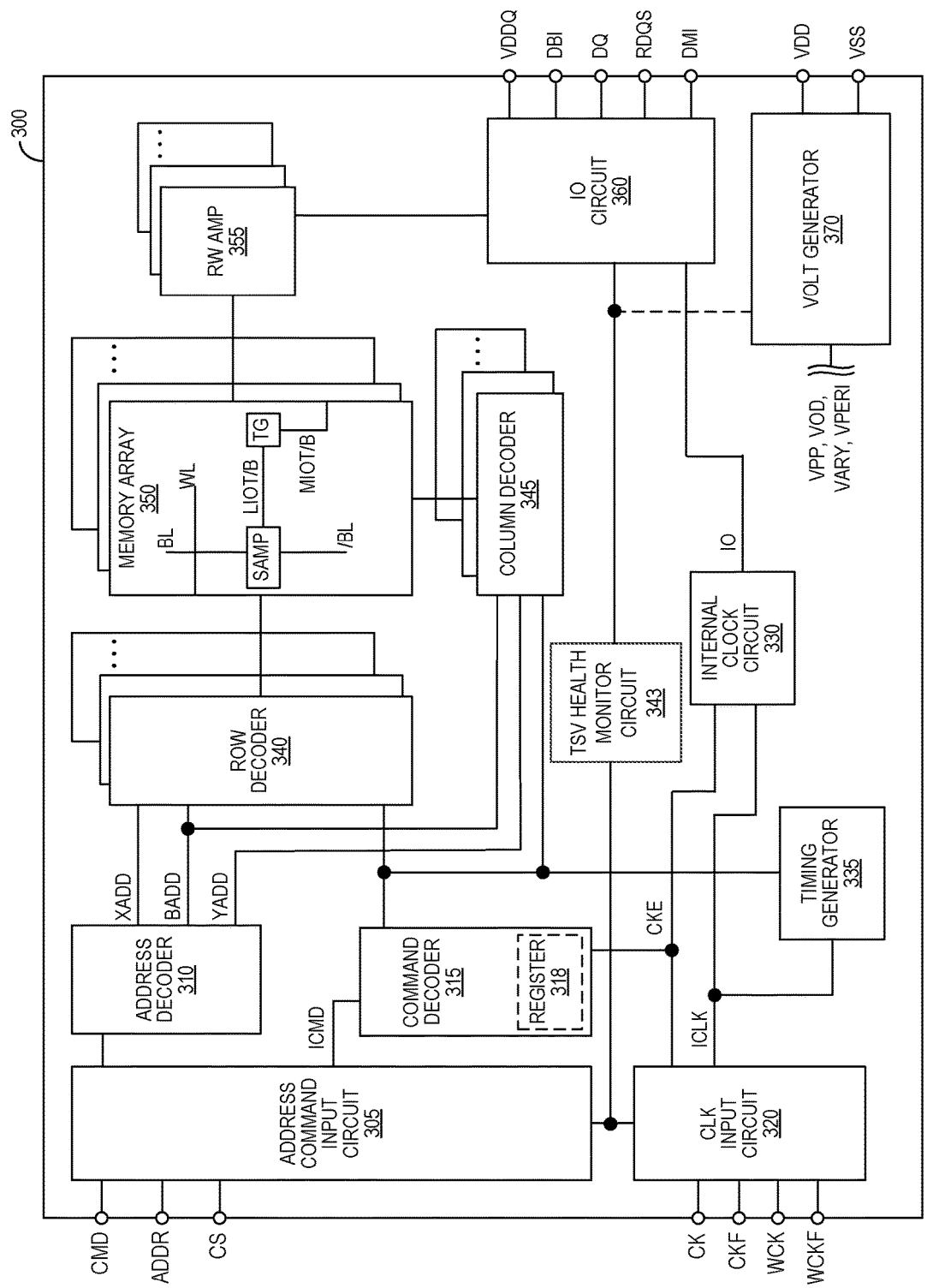
FIG. 3 is a block diagram schematically illustrating a memory die configured in accordance with various embodiments of the present technology.

FIG. 3 is a block diagram schematically illustrating a memory device 300 (e.g., a memory die 300, such as a first, second, third, and/or fourth memory die 300a, 300b, 300c, and/or 300d of FIGS. 2A and 2B) configured in accordance with various embodiments of the present technology. The memory die 300 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI to receive data signals, and power supply terminals VDD, VSS, and VDDQ.

The power supply terminals of the memory die 300 may be supplied with power supply potentials VDD and VSS. These power supply potentials VDD and VSS can be supplied to an internal voltage generator circuit 370. The internal voltage generator circuit 370 can generate various internal potentials VPP, VOD, VARY, VPERI, and the like based on the power supply potentials VDD and VSS. The internal potential VPP can be used in the row decoder 340, the internal potentials VOD and VARY can be used in sense amplifiers included in the memory array 350 of the memory die 300, and the internal potential VPERI can be used in many other circuit blocks.

The power supply terminals may also be supplied with power supply potential VDDQ. The power supply potential VDDQ can be supplied to the IO circuit 360 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the IO circuit 360 so that power supply noise generated by the IO circuit 360 does not propagate to the other circuit blocks.

The clock terminals and data clock terminals may be supplied with external clock signals and complementary external clock signals. The external clock signals CK, CKF, WCK, WCKF can be supplied to a clock input circuit 320. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 320 can receive the external clock signals. For example, when enabled by a CKE signal from a command decoder 315, an input buffer can receive the CK and CKF signals and the WCK and WCKF signals. The clock input circuit 320 can receive the external clock signals to generate internal clock signals ICLK. The internal clock signals ICLK can be supplied to an internal clock circuit 330. The internal clock circuit 330 can provide various phase and frequency controlled internal clock signals based on the received internal clock signals ICLK and a clock enable signal CKE from the command decoder 315. For example, the internal clock circuit 330 can include a clock path (not shown in FIG. 3) that receives the internal clock signal ICLK and provides various clock signals to the command decoder 315. The internal clock circuit 330 can further provide input/output (IO) clock signals. The IO clock signals can be supplied to an input/output (IO) circuit 360 and can be used as a timing signal for determining an output timing of read data and the input timing of write data. The IO clock signals can be provided at multiple clock frequencies so that data can be output from and input into the memory die 300 at different data rates. A higher clock frequency may be desirable when high memory speed is desired. A lower clock frequency may be desirable when lower power consumption is desired. The internal clock signals ICLK can also be supplied to a timing generator 335 and thus various internal clock signals can be generated that can be used by the command decoder 315, the column decoder 345, and/or other components of the memory die 300.

The memory die 300 may include an array of memory cells, such as memory array 350. The memory cells of the memory array 350 may be arranged in a plurality of memory regions, and each memory region may include a plurality of word lines (WL), a plurality of bit lines (BL), and a plurality of memory cells arranged at intersections of the word lines and the bit lines. In some embodiments, a memory region can be one or more memory banks or another arrangement of memory cells. In these and other embodiments, the memory regions of the memory array 350 can be arranged in one or more groups (e.g., groups of memory banks, one or more logical memory ranks or dies, etc.). Memory cells in the memory array 350 can include any one of a number of different memory media types, including capacitive, magnetoresistive, ferroelectric, phase change, or the like. The selection of a word line WL may be performed by a row decoder 340, and the selection of a bit line BL may be performed by a column decoder 345. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 350 may also include plate lines and corresponding circuitry for managing their operation.

As discussed above, the command terminals and address terminals may be supplied with an encoded address signal and a bank address signal from outside the memory die 400. The encoded address signal and the bank address signal supplied to the address terminals can be transferred, via a command/address input circuit 305, to an address decoder 310. The address decoder 310 can receive the address signals and supply a decoded row address signal (XADD) to the row decoder 340, and a decoded column address signal (YADD) to the column decoder 345. The address decoder 310 can also receive the bank address signal (BADD) and supply the bank address signal to both the row decoder 340 and the column decoder 345.

The command and address terminals can be supplied with encoded command signals CMD, address signals ADDR, and chip selection signals CS (e.g., from the memory controller 201 and/or a host device). The encoded command signals may represent various memory commands (e.g., including access commands, which can include read commands and write commands). The select signal CS may be used to select the memory device 204 and/or the memory die 300 to respond to commands and addresses provided to the command and address terminals. When an active CS signal is provided to the memory die 300, the commands and addresses can be decoded (e.g., using a command decoder 315) and memory operations can be performed. The command signals CMD may be provided as internal command signals ICMD to the command decoder 315 via the command/address input circuit 305. The command decoder 315 may include circuits to decode the internal command signals ICMD to generate various internal signals and commands for performing memory operations, for example, a row command signal to select a word line and a column command signal to select a bit line. The internal command signals can also include output and input activation commands, such as a clocked command CMDCK (not shown) to the command decoder 315. The command decoder 315 may further include one or more registers 318 for tracking various counts or values.

When a read command is issued, and a row address and a column address are timely supplied with the read command, read data can be read from memory cells in the memory array 350 designated by the row address and the column address. The read command may be received by the command decoder 315, which can provide internal commands to the JO circuit 360 so that read data can be output from the data terminals DQ, RDQS, DBI, and DMI via read/write (RW) amplifiers 355 and the JO circuit 360 according to the RDQS clock signals. The read data may be provided at a time defined by read latency information RL that can be programmed in the memory die 300 or 3DS 219 of memory dies 300, for example in a mode register (not shown in FIG. 3). The read latency information RL can be defined in terms of clock cycles of the CK clock signal. For example, the read latency information RL can be a number of clock cycles of the CK signal after the read command is received by the memory die 300 when the associated read data is provided.

When a write command is issued, and a row address and a column address are timely supplied with the command, write data can be supplied to the data terminals DQ, DBI, and DMI over DQ lines connected to the memory die 300 according to the WCK and WCKF clock signals. The write command may be received by the command decoder 315, which can provide internal commands to the JO circuit 360 so that the write data can be received by data receivers in the JO circuit 360, and supplied via the JO circuit 360 and the RW amplifiers 355 to the memory array 350 over JO lines of the memory die 300 or stack 219 of memory dies 300. The write data may be written in the memory cell designated by the row address and the column address. The write data may be provided to the data terminals at a time that is defined by write latency WL information. The write latency WL information can be programmed in the memory die 300, for example, in the mode register (not shown in FIG. 3). The write latency WL information can be defined in terms of clock cycles of the CK clock signal. For example, the write latency information WL can be a number of clock cycles of the CK signal after the write command is received by the memory die 300 when the associated write data is received.

The memory array 350 may be refreshed or maintained to prevent data loss, either due to charge leakage or imprint effects. A refresh operation, may be initiated by the memory die 300, by the memory system 200 (e.g., by the memory controller 201 of FIG. 2A), and/or by a host device, and may include accessing one or more rows (e.g., WL) and discharging cells of the accessed row to a corresponding SAMP. While the row is opened (e.g., while the accessed WL is energized), the SAMP may compare the voltage resulting from the discharged cell to a reference. The SAMP may then write back a logic value (e.g., charge the cell) to a nominal value for the given logic state. In some cases, this write back process may increase the charge of the cell to ameliorate the discharge issues discussed above. In other cases, the write back process may invert the data state of the cell (e.g., from high to low or low to high), to ameliorate hysteresis shift, material depolarization, or the like. Other refresh schemes or methods may also be employed.

In one approach, the memory die 300 may be configured to refresh the same row of memory cells in every memory bank of the memory array 350 simultaneously. In another approach, the memory die 300 may be configured to refresh the same row of memory cells in every memory bank of the memory array 350 sequentially. In still another approach, the memory die 300 can further include circuitry (e.g., one or more registers, latches, embedded memories, counters, etc.) configured to track row (e.g., word line) addresses, each corresponding to one of the memory banks in the memory array 350. In this approach, the memory die 300 is not constrained to refresh the same row in each memory bank of the memory array 350 before refreshing another row in one of the memory banks.

Regardless of the refresh approach, the memory die 300 can be configured to refresh memory cells in the memory array 350 within a given refresh rate or time window (e.g., 32 ms, 28 ms, 25 ms, 23 ms, 21 ms, 18 ms, 16 ms, 8 ms, etc.), known as tREF. In these embodiments, the memory device 204 and/or the memory system 200 can be configured to supply refresh commands to the memory die 300 in accordance with a specified minimum cadence tREFI. For example, the memory device 204 and/or the memory system 200 can be configured to supply one or more refresh commands to the memory die 300 at least every 7.8 µs such that an approximate minimum of 4000 refresh commands are supplied to the memory die 300 within a 32 ms time window.

The memory die 300 further includes TSV health monitor circuitry 339. In some embodiments, the TSV health monitor circuitry 339 includes die transistors electrically coupling two or more TSVs to one another. For example, the TSV health monitor circuitry 339 can be electrically coupled to the command/address input circuit 305, the clock input circuit 320, and/or the IO circuit 360. In these embodiments, the TSV health monitor circuitry 339 can include a die transistor between every pair of neighboring (e.g., immediately adjacent, nearest, etc.) signaling TSVs of the memory die 300. In other embodiments, the TSV health monitor circuitry 339 can include a die transistor between select pairs of neighboring signaling TSVs. In these and still other embodiments, the TSV health monitor circuitry 339 can be electrically coupled to the internal voltage generator circuit 370 and include die transistors between every pair or select pairs of neighboring power TSVs of the memory die 300. Additionally, or alternatively, the TSV health monitor circuitry 339 can include bypass transistors electrically connected directly to a corresponding TSV. The bypass transistors are configured to bypass input buffers of each pair of electrically coupled TSVs. This ensures that voltage/current measurements taken by the TSV health monitor circuitry 339 (discussed in greater detail below) characterize the corresponding TSVs as opposed to the input impedance of the input buffers.

In operation, the TSV health monitor circuitry 339 (e.g., in a test mode of the memory die 300, using the system controller 201, using internal logic of the memory die 300, etc.) can selectively activate the bypass transistors and corresponding die transistors(s) to form temporary test circuits using the corresponding pair of TSVs. The TSV health monitor circuitry 339 can transmit a test voltage using the formed circuits and measure the corresponding voltage/current. The TSV health monitor circuitry 339 can use the measurements to calculate series resistance of a corresponding formed circuit, and can compare the series resistance to the series resistances of other temporary test circuits formed using other pairs of TSVs to identify outliers and to locate TSV defects/voids.

Figure 4A:
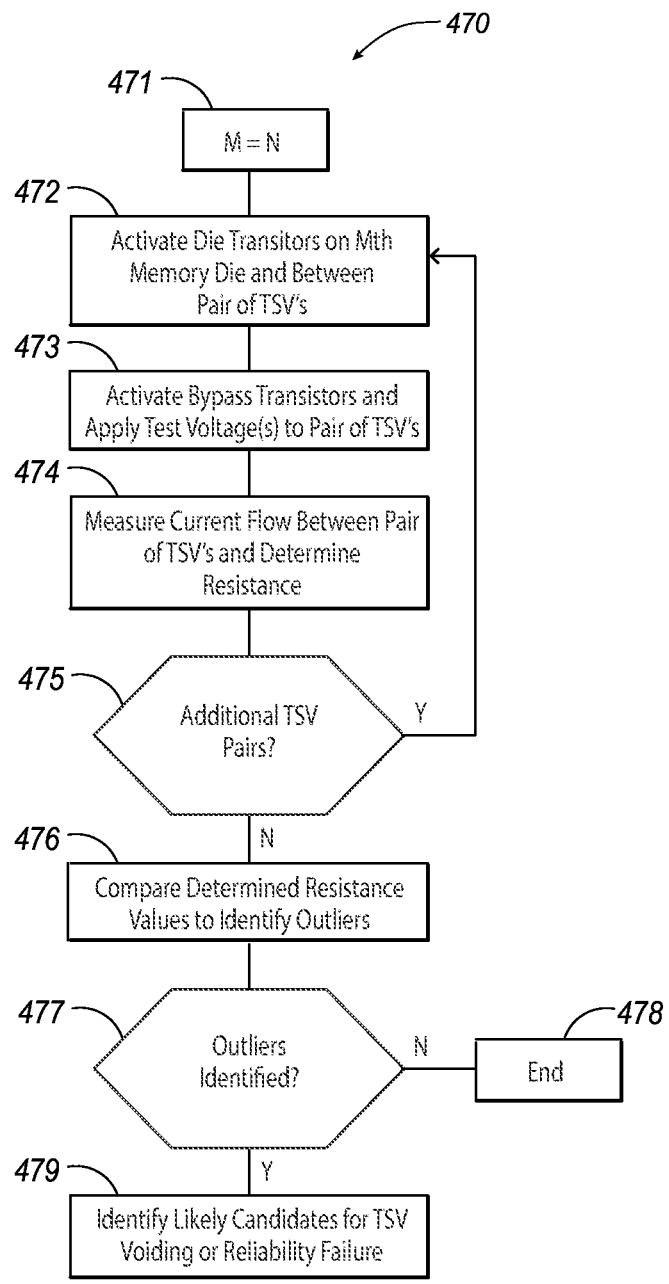
FIGS. 4A and 4B are a flow diagrams illustrating TSV health monitor routines of a memory device configured in accordance with various embodiments of the present technology.
Figure 4B:
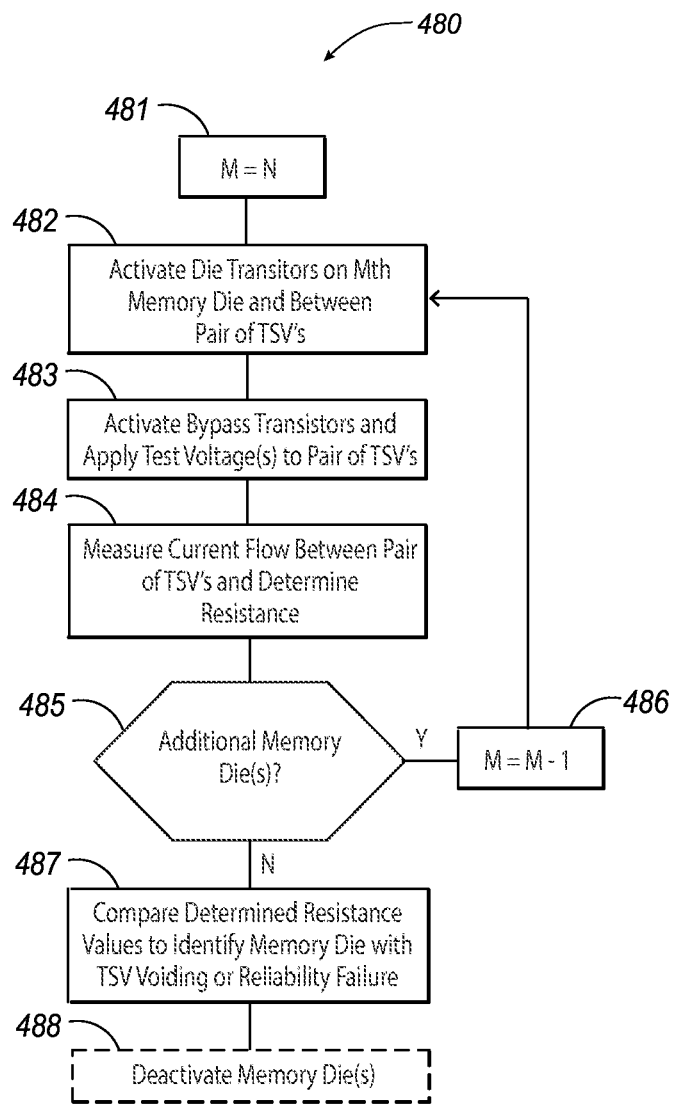

FIGS. 4A and 4B are flow diagrams illustrating TSV health monitor routines 470 and 480, respectively, of a memory die and/or memory device in accordance with various embodiments of the present technology. In some embodiments, the routines 470 and/or 480 can be executed, at least in part, by the memory die, the memory device, a memory controller operably connected to the memory die/device, and/or a host device operably connected to the memory controller and/or to the memory die/device. For example, all or a subset of the steps of the routines 470 and/or 480 can be carried out by TSV health monitor circuitry, die transistors, TSVs, and/or bypass transistors of a memory device and/or of a memory die of the memory device. In these and other embodiments, all or a subset of the steps of the routines 470 and/or 480 can be performed by other components of the memory device, by components of the memory controller, by components of the host device, and/or by other components of a memory system containing the memory device. In some embodiments, the routines 470 and/or 480 can be executed during a test mode of the memory die, memory device, and/or memory system. For example, a test mode key can be used to cycle through all or a subset of possible TSV combinations and/or connections.

The routine 470 can begin at block 471 by setting a variable "M" equal to a value "N." In some embodiments, the value "N" represents the highest activated memory die in a 3DS of a memory device. Using FIGS. 2A and 2B as examples, the routine 470 can set the variable "M" equal to three (3), indicating that the fourth memory die 300d is the highest activated memory die in the 3DS. In other embodiments, the value "N" can represent another memory die of the memory device (e.g., the first memory die, the last memory die, the lowest memory die, etc.). In some embodiments, the routine 470 can track the variable "M," the value "N," and/or the highest activated memory die in a 3DS (e.g., using registers, counters, lookup tables, etc.).

At block 472, the routine 470 activates one or more die transistors on the "Mth" memory die of the 3DS electrically positioned between a pair of TSVs. In some embodiments, the routine 470 can activate the one or more die transistors by applying a voltage (e.g., Vdd or another voltage) to the gates of the one or more die transistors. Using FIG. 2B as an example, the routine 470 can apply a voltage Vdd to the gate of the die transistor 262d, thereby electrically connecting TSVs 215 and 216 across the transistor 262d. In some embodiments, the pair of TSVs are signaling TSVs. In other embodiments, the pair of TSVs are power TSVs. Additionally, or alternatively, the pair of TSVs can be two neighboring TSVs physically positioned nearest to one another or that are immediately adjacent one another. In these and still other embodiments, the one or more die transistors can be activated in accordance with a predefined and/or desired order. For example, the routine 470 can activate the die transistors of the memory die/device in accordance with an order defined by a test key of a test mode of the memory die/device.

At block 473, the routine 470 activates corresponding bypass transistors and applies one or more test voltage(s) to the formed circuit. Returning to the above example with reference to FIG. 2B, the routine 470 can activate bypass transistors 255 and 256 to form a temporary test circuit (e.g., a passive circuit) comprising the bypass transistor 255, the TSV 215, the activated die transistor 262d, the TSV 216, and the bypass transistor 256. The routine 470 can apply a test voltage Vmeas (e.g., a voltage equivalent to the threshold voltage Vth of the bypass transistor 255 minus voltage Vdd) to the bypass transistor 255 while holding the other bypass transistor 256 at a ground voltage Vss (or vice versa). Thus, in this example, current bypasses the input buffer 245 of the memory device 204 via the bypass transistor 255, is transmitted up the TSV 215 to the fourth memory die 300d and across the activated die transistor 262d, is transmitted down the TSV 216, and bypasses the input buffer 246 via the bypass transistor 256.

At block 474, the routine 470 measures the current flow over the temporary test circuit formed at block 473 and calculates a corresponding series resistance value. Using the above example, the routine 470 can measure the current flow from the bypass transistor 255 to the bypass transistor 256. Using the measured value, the routine 470 can calculate a series resistance of the bypass transistor 255, the TSV 215, the die transistor 262d, the TSV 216, and the bypass transistor 256. Because current flow bypasses the input buffers 245 and 246, the input impedances of the input buffers 245 and 246 are not included in the series resistance calculated at block 474. This permits a better characterization of the health of the TSVs 215 and 216. In some embodiments, the routine 470 can store the calculated series resistance for further processing and/or analysis. Additionally, or alternatively, the routine 470 can measure and/or calculate other values, such as voltage or capacitance at various points along the passive test circuit.

At block 475, the routine 470 determines whether there are additional pairs of TSVs to test/analyze. If the routine 470 determines that there are additional pairs of TSVs to test or analyze, the routine 470 returns to block 472 to activate one or more die transistors electrically positioned between a next pair of TSVs in the "Mth" memory die of the 3DS. For example, the routine 470 can return to block 472 to activate the die transistor 263d of the fourth memory die 300d in the 3DS to electrically couple the TSV 216 with the TSV 217. On the other hand, if the routine 470 determines that no additional pairs of TSVs remain, the routine 470 can proceed to block 476.

At block 476, the routine 470 compares the series resistance(s) calculated at block 474 to identify outliers. In some embodiments, the routine 470 compares each calculated series resistance to a desired series resistance value (e.g., to a predetermined series resistance value) or a desired range of series resistance values. In these and other embodiments, the routine 470 compares calculated series resistances to one another. In some embodiments, an outlier is identified as any calculated series resistance value that this significantly greater (e.g., 2%, 5%, 7%, 10%, 20%, 33%, 50%, or greater) relative to the other series resistance values calculated at block 474.

At block 477, the routine 470 determines whether outliers were identified at block 476. If the routine 470 determines no outliers were identified at block 476, the routine 470 can proceed to block 478 and terminate. On the other hand, if the routine 470 identifies one or more outliers, the routine 470 can proceed to block 479.

At block 479, the routine 470 identifies one or more TSVs that are likely candidates for degradation and/or reliably failure. As used herein, the term "degradation" can include voiding, intermetallic contamination, incompletely coupled interconnects, discontinuity, or other defects, including those that were present at the time of manufacturing/fabrication as well as those that develop at a later point in time (e.g., due to physical or electrical stress). The term "reliability failure" refers to a condition in which a component does not (fully or partially) function as intended (e.g., due to a degradation). Returning to the above example, if the routine 470 determines that the series resistance calculated at block 474 for the temporary test circuit comprising the TSVs 215, the TSV 216, and the die transistor 262d is an outlier, the routine 470 can identify the TSVs 215 and 216 as likely candidates for degradation and/or reliability failure. In some embodiments, the routine 470 can further compare the outlier to other calculated series resistance values related to the outlier value to isolate the most likely TSV candidate. For example, the routine 470 can compare the outlier series resistance value for the circuit formed using the TSVs 215 and 216 to the series resistance values for (a) a circuit formed using a TSV 214 (not shown in FIG. 2B) and the TSV 215 and/or (b) a circuit formed using the TSVs 216 and 217. Continuing with this example, if the calculated series resistance for the TSVs 216 and 217 is also an outlier value and the calculated series resistance for the TSVs 214 and 215 is not an outlier value, then the routine 470 can determine that only the TSV 216 (and not the TSV 215) is a likely candidate for degradation and/or reliability failure. In some embodiments, the routine 470 can deactivate the TSV 216 and replace it with an unused, redundant TSV (e.g., if available). In other embodiments, the routine 470 can proceed to block 481 of the routine 480.

Referring now to FIG. 4B, the routine 480 can begin at block 481 by setting a variable "M" equal to a value "N." In some embodiments, the variable "M" is the same or a similar variable "M" as used in the routine 470 (FIG. 4A). In these embodiments, the routine 480 can set the variable "M" equal to the value "N" consistent with the discussion above with respect to block 471 of the routine 470. In some embodiments, the routine 480 can track the variable "M," the value "N," and/or the highest activated memory die in a 3DS (e.g., using registers, counters, lookup tables, etc.).

At block 482, the routine 480 activates one or more die transistors on the "Mth" memory die of the 3DS electrically positioned between one or more pairs of TSVs. In some embodiments, the routine 480 can activate the one or more die transistors on the "Mth" memory die in the 3DS consistent with the discussion above with respect to block 472 of the routine 470 (FIG. 4A). In embodiments where the routine 470 is executed at least in part before the routine 480 is executed, each pair of TSVs can include at least one TSV identified as a likely candidate for degradation and/or reliability failure at block 479 of the routine 470.

At block 483, the routine 480 activates corresponding bypass transistors and applies one or more test voltages to the formed circuit. In some embodiments, the routine 480 can activate the corresponding bypass transistors and/or apply the test voltage(s) consistent with the discussion above with respect to block 473 of the routine 470 (FIG. 4A).

At block 484, the routine 480 measures the current flow over the temporary test circuit formed at block 483 and calculates a corresponding series resistance value. In some embodiments, the routine 480 can measure the current flow and calculate the corresponding series resistance value consistent with the discussion above with respect to block 474 of the routine 470 (FIG. 4A). As discussed in greater detail below, however, the various series resistance(s) calculated at block 484 of the routine 480 represents the series resistance(s) of the same pair of TSVs at a variety of heights corresponding to the "Mth" memory die. In these and other embodiments, the routine 480 can store the calculated series resistance(s) for further processing and/or analysis. Additionally, or alternatively, the routine 480 can measure and/or calculate other values, such as voltage or capacitance at various points along the passive circuit.

At block 485, the routine 480 determines whether there remains one or more other memory dies in the 3DS and/or in the memory device to test/analyze. For example, because the value "N" represents the highest memory die in a 3DS and because the routine 480 in the embodiment illustrated in FIG. 4B tests TSVs in memory devices starting with the highest memory die of a 3DS and works down to the lowest memory die in the 3DS, the routine 480 can determine that there remains one or more other memory dies in the 3DS to test/analyze if the current value of the variable "M" does not equal zero (0). If the routine 480 determines that there remains one or more other memory dies to test/analyze, the routine 480 proceeds to block 486. Otherwise, the routine 480 proceeds to block 487.

At block 486, the routine 480 updates the variable "M." For example, if the variable "M" is originally set equal to the value "N" at blocks 471 of the routine 470 (FIG. 4A) and/or at block 481 of the routine 480, and if the value "N" represents the highest memory die in a 3DS of a memory device, then the routine 480 can decrease the variable "M" by one such that the variable "M" points to the next highest memory die in the 3DS. In other embodiments, the routine 480 can otherwise update the variable "M" in a manner consistent with the representation of the value "N" to point to a next memory die of the memory device. The routine 480 then returns to block 482 to activate one or more die transistors on the "Mth" memory die of the 3DS electrically positioned between the pair(s) of TSVs.

At block 487, the routine 480 compares the series resistance(s) calculated at block 484 to identify a memory die of a 3DS and/or of a memory device that exhibits signs of TSV degradation and/or reliability failure. In some embodiments, the routine 480 compares each calculated series resistance to a desired series resistance value (e.g., to a predetermined series resistance value) or a desired range of series resistance values. In these and other embodiments, the routine 480 compares calculated series resistances to one another. For example, in the context of a 3DS, the routine 480 can determine that a TSV of a specific memory die has degradation and/or is exhibiting signs of reliability failure by determining that the series resistance calculated at block 484 for a height corresponding to that memory die is significantly greater (e.g., 2%, 5%, 7%, 10%, 20%, 33%, 50%, or greater) than the series resistance(s) calculated at block 484 for one or more heights corresponding to other memory dies that are lower in the 3DS. Furthermore, because TSVs are often shared by multiple memory dies in the 3DS, the series resistance(s) calculated at block 484 for one or more heights corresponding to other memory dies that are higher in the 3DS will also be significantly greater (e.g., 2%, 5%, 7%, 10%, 20%, 33%, 50%, or greater) than the series resistance(s) calculated for the lower memory dies of the 3DS. This can aid the routine 480 to locate a defect and/or degradation in a TSV to within a specific memory die of the 3DS.

In some embodiments, the routine 480 can proceed to block 488 to deactivate one or more memory dies. For example, the routine 480 can deactivate a memory die that includes a defective and/or degrading portion of a TSV and/or that is otherwise exhibiting signs of TSV degradation and/or reliability failure. In the context of a 3DS, the routine 480 in these and other embodiments can deactivate one or more memory dies that are positioned higher in the 3DS than the memory die that includes the defective portion of the TSV and/or can deactivate one or more memory dies that otherwise receive/send signals over the defective portion of the TSV. In this manner, the routine 480 can recover unaffected portions of a memory device in the event of degradation or a reliability failure on a portion of a TSV (e.g., on a portion of a signaling TSV) of the memory device. As such, the TSV defect or degradation is rarely fatal to the entire memory device.

Although the steps of the routines 470 and 480 are discussed and illustrated in a particular order, the methods illustrated by the routines 470 and 480 in FIGS. 4A and 4B, respectively, are not so limited. In other embodiments, the methods can be performed in different orders. In these and other embodiments, any of the steps of the routines 470 and/or 480 can be performed before, during, and/or after any of the other steps of the routines 470 and/or 480. Moreover, a person of ordinary skill in the relevant art will readily recognize that the illustrated method can be altered and still remain within these and other embodiments of the present technology. For example, one or more steps of the routines 470 and/or 480 illustrated in FIGS. 4A and 4B, respectively, can be omitted and/or repeated in some embodiments. As a specific example, if the routine 470 (FIG. 4A) initially calculates the series resistance value(s) for one or more TSVs that are likely candidates for degradation or reliability failure (block 474) before proceeding to the routine 480, the routine 480 can (i) use the series resistance value(s) calculated by the routine 470, (ii) omit block 481, and/or (iii) begin at block 486. As another example, the routine 470 can activate one or more die transistors on one or more memory dies of a 3DS other than the highest memory die, and/or the routine 480 can activate one or more die transistors on one or more memory dies of a 3DS in a different order of memory dies (e.g., in an order starting with the lowest memory die in the 3DS).

Figure 5:
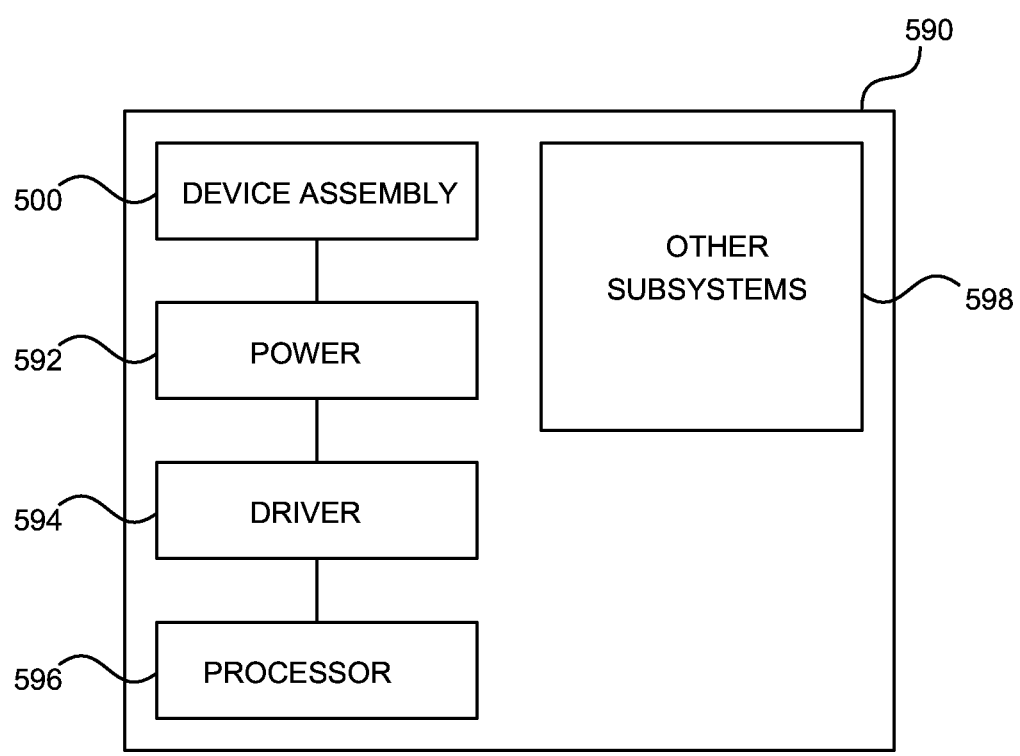
FIG. 5 is a schematic view of a system that includes a memory device configured in accordance with various embodiments of the present technology.

FIG. 5 is a schematic view of a system that includes a memory device in accordance with embodiments of the present technology. Any one of the foregoing memory devices described above with reference to FIGS. 1-4B can be incorporated into any of a myriad of larger and/or more complex systems, a representative example of which is system 590 shown schematically in FIG. 5. The system 590 can include a semiconductor device assembly 500, a power source 592, a driver 594, a processor 596, and/or other subsystems and components 598. The semiconductor device assembly 500 can include features generally similar to those of the memory device described above with reference to FIGS. 1-4B, and can, therefore, include various features of memory content authentication. The resulting system 590 can perform any of a wide variety of functions, such as memory storage, data processing, and/or other suitable functions. Accordingly, representative systems 590 can include, without limitation, hand-held devices (e.g., mobile phones, tablets, digital readers, and digital audio players), computers, vehicles, appliances, and other products. Components of the system 590 may be housed in a single unit or distributed over multiple, interconnected units (e.g., through a communications network). The components of the system 590 can also include remote devices and any of a wide variety of computer readable media.

CONCLUSION

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented and/or discussed in a given order, alternative embodiments can perform steps in a different order. Furthermore, the various embodiments described herein can also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms can also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms can also include the plural or singular term, respectively. Furthermore, as used herein, the phrase "and/or" as in "A and/or B" refers to A alone, B alone, and both A and B. Additionally, the terms "comprising," "including," "having" and "with" are used throughout to mean including at least the recited feature(s) such that any greater number of the same feature and/or additional types of other features are not precluded.

From the foregoing, it will also be appreciated that various modifications can be made without deviating from the technology. For example, various components of the technology can be further divided into subcomponents, or that various components and functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein.

What is claimed is:

1. A memory device, comprising:
a plurality of memory dies;
a plurality of through-silicon vias (TSVs), each TSV in electrical communication with each of the plurality of memory dies; and
circuitry configured to:
electrically couple, via a transistor, a pair of signaling TSVs of the plurality of TSVs to one another within a memory die of the plurality of memory dies to form a passive circuit that extends (a) along a first signaling TSV of the pair of signaling TSVs between a package substrate or another memory die of the plurality of memory dies and the memory die, (b) across the transistor, and (c) along a second signaling TSV of the pair of signaling TSVs between the memory die and the other memory die or the package substrate, and
apply a test voltage to the passive circuit.

2. The memory device of claim 1, wherein the transistor is a first transistor in the memory die of the plurality of memory dies, and wherein the circuitry is configured to electrically couple, via a second transistor in the other memory die of the plurality of memory dies, the pair of signaling TSVs to one another.

3. The memory device of claim 2, wherein:
the passive circuit is a first passive circuit;
the circuitry is configured to electrically couple the pair of signaling TSVs to one another via the second transistor to form a second passive circuit different from the first passive circuit; and
the second passive circuit extends (a) along the first signaling TSV between the package substrate or the memory die and the other memory die, (b) across the second transistor, and (c) along the other signaling TSV between the other memory die and the package substrate or the memory die.

4. The memory device of claim 1, wherein the circuitry includes at least one bypass transistors, and wherein the at least one bypass transistor is electrically connected directly to the first signaling TSV such that the passive circuit bypasses an input buffers electrically coupled to the first signaling TSVs.

5. The memory device of claim 1, wherein, using the test voltage, the circuitry is further configured to measure a current flow across the passive circuit.

6. The memory device of claim 5, wherein the circuitry is further configured to determine a resistance of the passive circuit.

7. The memory device of claim 6, wherein the passive circuit is a first passive circuit and the pair of signaling TSVs is a first pair of TSVs, and wherein the circuitry is further configured to:
compare the calculated resistance of the first passive circuit to a resistance of a second passive circuit including a second pair of TSVs; and
deactivate at least one memory die of the plurality of memory dies in response to the resistance of the first passive circuit exceeding the resistance of the second passive circuit by more than a threshold.

8. The memory device of claim 1, wherein the plurality of memory dies are arranged in a three-dimensional stack (3DS) of memory dies, and wherein the circuitry includes at least one transistor in each memory die of the 3DS that the circuitry is configured to use to electrically couple the pair of signaling TSVs to one another.

9. The memory device of claim 1, wherein the plurality of memory dies are arranged in a three-dimensional stack (3DS) of memory dies, and wherein the circuitry includes one or more transistors in only the uppermost memory die of the 3DS that the circuitry is configured to use to electrically couple the pair of signaling TSVs to one another.

10. The memory device of claim 1, wherein the circuitry includes one or more transistors between only signaling TSVs of the plurality of TSVs.

11. The memory device of claim 1, wherein the first and second signaling TSVs are immediately adjacent or are the nearest TSVs to one another within the memory device.

12. A memory device, comprising:
  at least one memory die;
  at least two through-silicon vias (TSVs), each TSV in electrical communication with each of the at least one memory die; and
  circuitry configured to:
    activate a transistor within a memory die of the at least one memory die, such that a pair of signaling TSVs of the at least two TSVs are electrically coupled to one another to form a passive circuit that extends (a) along a first signaling TSV of the pair of signaling TSVs, (b) across the transistor, and (c) along a second signaling TSV of the pair of signaling TSVs, and
      while activating the transistor, apply at least one test signal to the passive circuit to detect degradation on at least a portion of the first signaling TSV or on at least a portion of the second signaling TSV.

13. A method, comprising:
  electrically coupling a pair of signaling through-silicon vias (TSVs), wherein electrically coupling the pair of signaling TSVs includes activating a transistor such that the pair of signaling TSVs are electrically coupled to one another within a memory die to form a passive circuit that extends (a) along a first signaling TSV of the pair of signaling TSVs, (b) across the transistor, and (c) along a second signaling TSV of the pair of signaling TSVs;
  determining a resistance of the passive circuit; and
  based at least in part on the determined resistance, determining whether the first signaling TSV or the second signaling TSV includes degradation.

14. The method of claim 13, further comprising activating a bypass transistors such that the passive circuit bypasses an input buffers electrically coupled to the first signaling TSV.

15. The method of claim 13, wherein calculating the determined resistance of the passive circuit includes applying a test voltage to the passive circuit and measuring current flow over the passive circuit.

16. The method of claim 13, further comprising comparing the determined resistance of the passive circuit to one or more determined resistances of other passive circuits.

17. The method of claim 13, further comprising determining whether the determined resistance of the passive circuit is an outlier based at least in part on a comparison of the determined resistance of the passive circuit to the one or more determined resistances of other passive circuits.

18. The method of claim 13, wherein determining whether the first signaling TSV or the second signaling TSV includes degradation includes comparing the determined resistance of the passive circuit to one or more determined resistances of other passive circuits, and wherein at least one of the other passive circuits include at least one of the first signaling TSV or the second signaling TSV.

19. The method of claim 13, wherein the memory die is a first memory die, the transistor is a first transistor, and the passive circuit is a first passive circuit, and wherein the method further comprises:
  electrically coupling the pair of signaling TSVs within a second memory die, wherein electrically coupling the pair of signaling TSVs within the second memory die includes activating a second transistor such that the pair of signaling TSVs are electrically coupled to one another, via the second transistor, within the second memory die to form a second passive circuit;
  determining a resistance of the second passive circuit; and
  based at least in part on the determined resistance of the second passive circuit, determining (i) whether a first portion of the first signaling TSV within the first memory die or a first portion of the second signaling TSVs within the first memory die includes degradation or (ii) whether a second portion of the first signaling TSV within the second memory die or a second portion of the second signaling TSV within the second memory die includes degradation.

20. The method of claim 13, wherein activating the transistor includes activating the transistor such that the passive circuit extends (a) along the first signaling TSV between a package substrate or another memory die and the memory die, (b) across the transistor, and (c) along the second signaling TSV between the memory die and the package substrate or the other memory die.

* * * * *